US011407240B2

(12) United States Patent
Zollner et al.

(10) Patent No.: US 11,407,240 B2
(45) Date of Patent: Aug. 9, 2022

(54) DEVICE AND METHOD FOR GENERATING AN OUTPUT SIGNAL, FORMED AS A PULSE SEQUENCE, DEPENDING ON A SENSOR SIGNAL

(71) Applicant: Oce Holding B.V., Venlo (NL)

(72) Inventors: Werner Zollner, Eitting (DE); Michael Mayr, Munich (DE)

(73) Assignee: Canon Production Printing Holding B.V., Venlo (NL)

( * ) Notice: Subject to any disclaimer, the term of this patent is extended or adjusted under 35 U.S.C. 154(b) by 376 days.

(21) Appl. No.: 16/720,767

(22) Filed: Dec. 19, 2019

(65) Prior Publication Data

US 2020/0198380 A1 Jun. 25, 2020

(30) Foreign Application Priority Data

Dec. 19, 2018 (DE) .......................... 102018132933.4

(51) Int. Cl.
*B41J 13/00* (2006.01)
*H03K 21/00* (2006.01)
*H03K 3/78* (2006.01)

(52) U.S. Cl.
CPC ............ *B41J 13/0009* (2013.01); *H03K 3/78* (2013.01); *H03K 21/00* (2013.01)

(58) Field of Classification Search
CPC ... B41J 11/0095; B41J 13/0009; H03K 21/00; H03K 3/78
See application file for complete search history.

(56) References Cited

U.S. PATENT DOCUMENTS 5,170,417 A 12/1992 Winter
2010/0110125 A1* 5/2010 Lee ................... B41J 11/007
347/10

FOREIGN PATENT DOCUMENTS

DE 40 07 293 A1 9/1991
EP 2 081 772 B1 1/2013

OTHER PUBLICATIONS

German Office Action dated Jul. 24, 2019, for Application No. 10 2018 132 933.4.

* cited by examiner

*Primary Examiner* — Jannelle M Lebron
(74) *Attorney, Agent, or Firm* — The Webb Law Firm

(57) ABSTRACT

A device for generating an output signal, formed as a pulse sequence, with a sensor and a controller. The sensor generates a sensor signal based on a measurand determined by the sensor. The controller determines a number of pulses of a timing signal that are generated chronologically between two pulse edges of the sensor signal, the timing signal being generated by a timing signal generator. The controller also generates an intermediate timing signal formed as a pulse sequence, where the period duration of the intermediate timing signal is equal to the period duration of the timing signal multiplied with a factor that is equal to the determined number of pulses of the timing signal, divided by a predetermined divisor. The controller generates the output signal based on the intermediate timing signal.

19 Claims, 9 Drawing Sheets

DEVICE AND METHOD FOR GENERATING AN OUTPUT SIGNAL, FORMED AS A PULSE SEQUENCE, DEPENDING ON A SENSOR SIGNAL

CROSS REFERENCE TO RELATED APPLICATIONS

This patent application claims priority to German Patent Application No. 102018132933.4, filed Dec. 19, 2018, which is incorporated herein by reference in its entirety.

BACKGROUND

Field

The disclosure relates to a device and a method for generating an output signal, formed as a pulse sequence, depending on a sensor signal.

Related Art

In order to be able to print qualitatively high-grade and high-resolution print products, the activation of printing units, for example inkjet print heads, must take place with an activation frequency that is directly proportional to the velocity of a medium to be printed to, or of the transport means for transporting the medium to be printed to. Even slight discrepancies between the activation frequency and the velocity of the medium to be printed to, or of the transport means, lead to visible disturbances in the print image. In particular, a change in the velocity must quickly lead to a change of the activation frequency.

An encoder serving as a sensor is typically used to determine the velocity of the medium to be printed to, or of the transport means for transporting the medium to be printed to. The encoder may thereby be in direct contact with the transport means, wherein the encoder is, for example, a rotary encoder connected with the transport means via a frictional wheel. It is also possible to attach the rotary encoder to a bearing shaft of a transport roller. Inaccuracies in the measurement results may hereby occur, in particular due to slippage, contamination, or an unsteady surface of the transport means. The velocity signals that are determined directly from a drive activation also do not have a sufficiently exact relationship to the velocity of the medium to be printed, or of the transport medium for transporting the medium to be printed to.

Optical encoders may alternatively be used. However, these have previously not had the resolution required for print applications in particular.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

Figure 1:
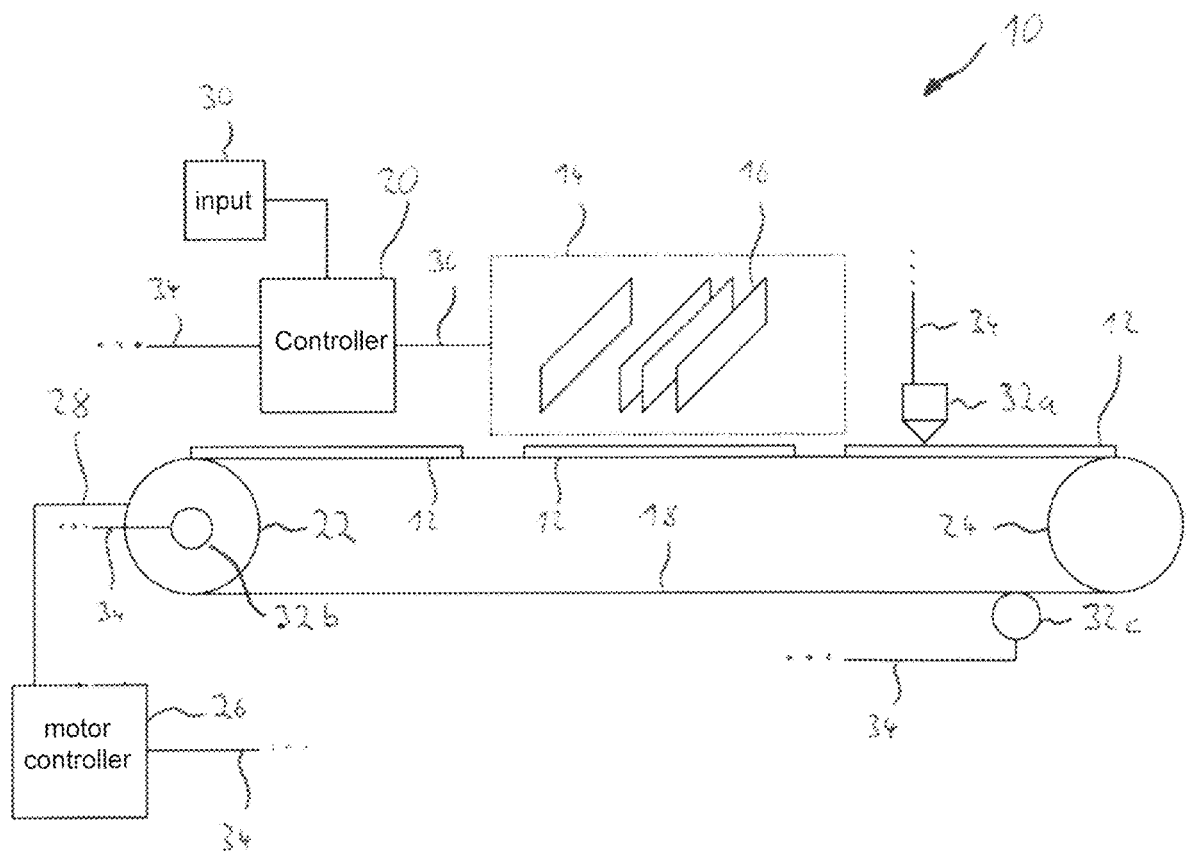
FIG. 1 illustrates a device for printing to a medium to be printed to according to an exemplary embodiment.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure.

An object of the disclosure is to provide a device and a method for generating an output signal, formed as a pulse sequence, depending on a sensor signal, which device and method enable a lossless resolution adaptation of the sensor signal at high reaction speed.

In an exemplar aspect of the present disclosure, a sensor signal formed as a first pulse sequence is converted into an intermediate timing signal formed as a second pulse sequence. In particular, the first pulse sequence may have a first spatial and/or temporal resolution, and the second pulse sequence may have a spatial and/or temporal resolution differing from the first resolution. The device and the method can be realized simply with the aid of simple integrated circuits, for example a field programmable gate array (FPGA), a complex programmable logic device (CPLD), or a digital signal processor, such that a high reaction speed is provided.

FIG. 1 shows a device 10 according to an exemplary embodiment, for printing to a medium 12 to be printed to, in a schematic depiction. In an exemplary embodiment, the device 10 includes the printing unit (printer) 14 with print heads 16, and a controller 20 that is configured to control the printing unit 14. The controller 20 can include processor circuitry that is configured to perform one or more operations and/or functions of the controller 20, including controlling the printing unit 14. Here, a transport belt 18 for transporting the medium 12 to be printed to relative to the printing unit 14 is shown by way of example. Alternatively, band-shaped medium may also be printed to, given which such a transport belt is not necessary.

The transport belt 18 or the band-shaped medium is driven by a drive roller 22 and travels across a deflection roller 24. The drive of the drive roller 22 is activated by a motor controller 26 with the aid of motor control signals 28. In an alternative embodiment, a band-shape medium is supplied from a take-off to the drive roller 22 and is received by a take-up after the deflection roller 24. The motor controller 26 can include processor circuitry that is configured to perform one or more operations and/or functions of the controller 26, including generating motor control signals 28 to control the operation of the drive roller 22.

In an exemplary embodiment, the controller 20 is connected with an input 30 configured to receive input control commands and/or parameters for controlling the printing unit 14, which are then provided to the controller 20. The controller 20 is also connected with a sensor that transmits a sensor signal 34 to the controller 20 depending on a path traveled by the medium 12 to be printed to. The controller 20 is, for example, realized as a circuit structure with the aid of a field programmable gate array (FPGA) or a complex programmable logic device (CPLD) or a digital signal processor.

In the shown exemplary embodiment, the sensor is designed as an optical encoder 32a. Alternatively or additionally, the sensor may also be designed as a rotary encoder 32b arranged at the drive roller 22 or another roller of the transport belt 18, for example the deflection roller 24, or as a rotary encoder 32c connected via a frictional wheel with the transport belt 18 or the band-shaped medium to be printed to. An additional alternative is to determine the sensor signal 34 from the motor control signals 28.

On the basis of the sensor signal 34, the controller 20 generates an output signal 36 that is used to control the printing unit 14. The controller 20 and the sensor 32a, 32b, 32c thus form an exemplary embodiment of a device for generating the output signal 36 formed as a pulse sequence according to patent claim 1. The device is described in detail in the following using FIG. 2, and there is designated with the reference character 100.

Figure 2:
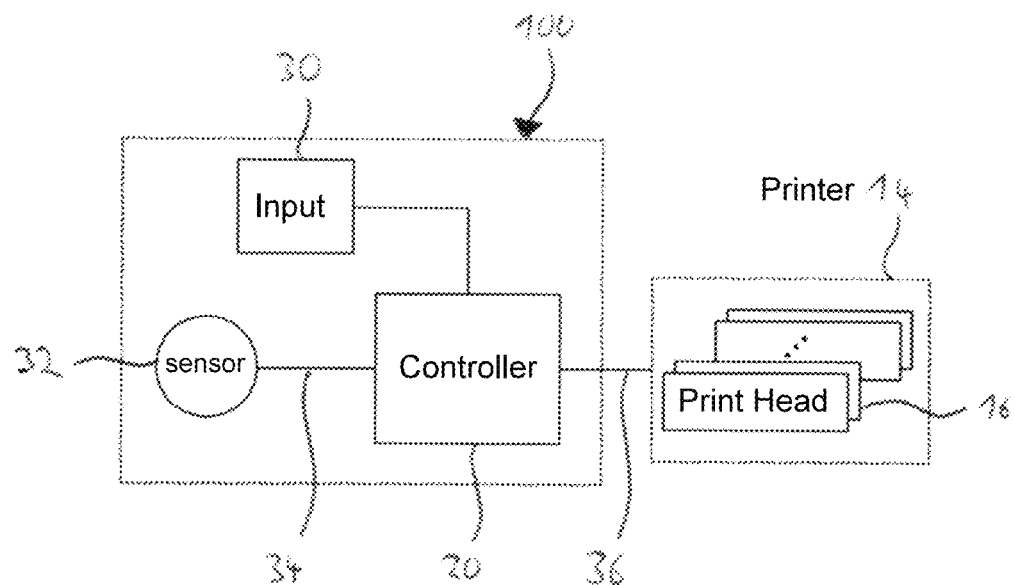
FIG. 2 illustrates components of a device, according to an exemplary embodiment, for generating an output signal formed as a pulse sequence.

FIG. 2 shows components of the device 100, according to an exemplary embodiment, for generating the output signal 36 formed as a pulse sequence. Components with identical design and/or identical function are designated with the same reference characters. The reference character 32 is used overall for the sensors 32a through 32c.

In the shown exemplary embodiment, the device 100 generates the output signal 36, which has for example a resolution of 1/7200 of an inch, from the sensor signal 34 of the sensor 32, which for example has a resolution of 4 µm. In particular, a desired resolution of the output signal 36 may be input in the controller 20 with the aid of the input unit 30.

An increase in the resolution of the sensor 32 is achieved via the device 100, wherein at the same time a conversion of the metric sensor signal 34 into the inch-based Anglo-American measurement system (which is used in particular in printing applications) is performed. The increase in the resolution and the conversion between measurement systems is explained in detail further below using two embodiments of the device 100 that are described using FIGS. 3 through 9 and designated there with the reference characters 100a or 100b.

Figure 3:
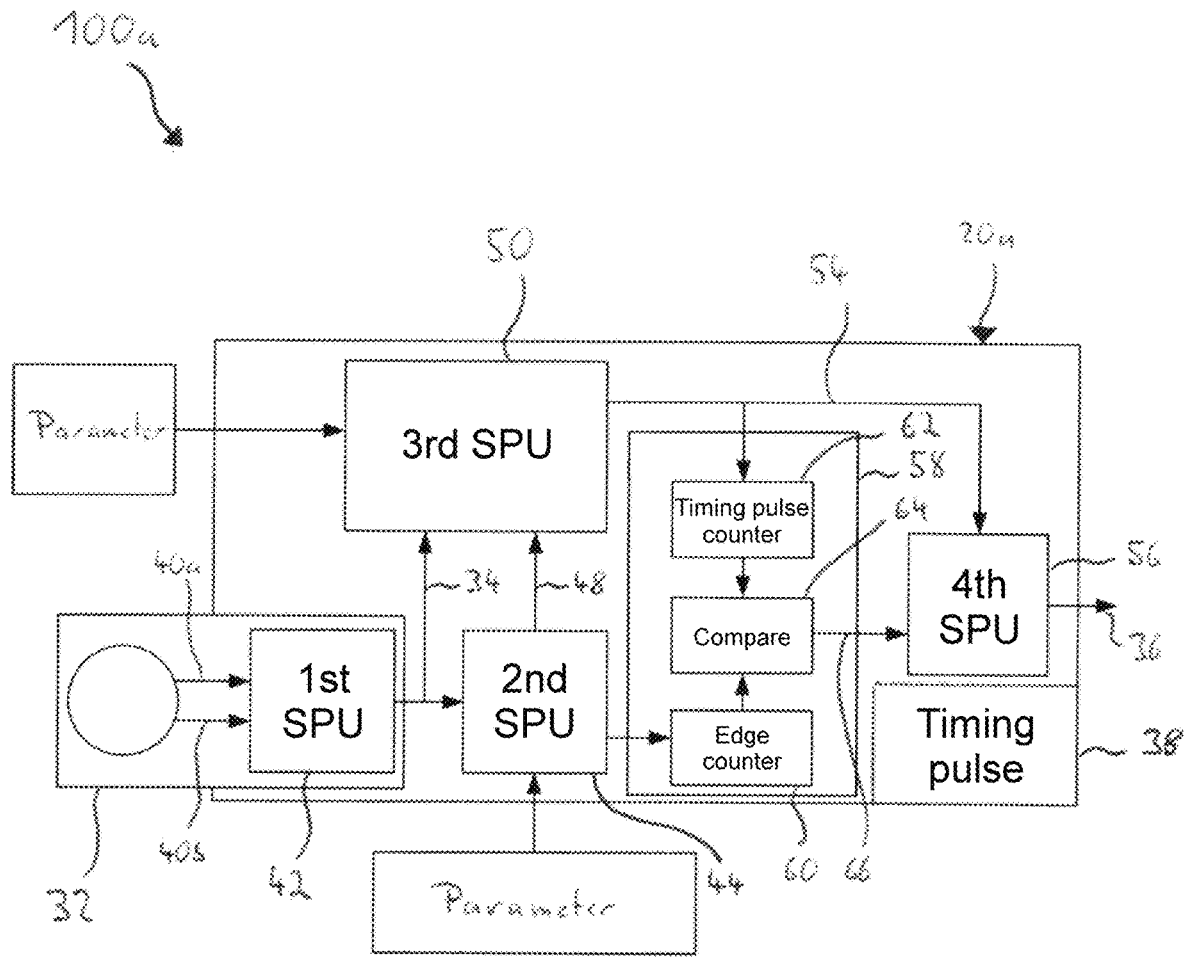
FIG. 3 illustrates a device for generating the output signal formed as a pulse sequence according to an exemplary embodiment.

FIG. 3 shows a block diagram of a device 100a, according to an exemplary embodiment, for generating the output signal 36 formed as a pulse sequence according to a first embodiment. The device 100a includes a controller 20a and the sensor 32.

In the shown exemplary embodiment, the sensor 32 has a first signal processor 42 and generates two measurement signals 40a, 40b depending on the medium 12 to be printed to or the path traveled by the transport belt 18. The two measurement signals 40a, 40b are respectively formed as a pulse sequence of rectangular pulses. The first measurement signal 40a and the second measurement signal 40b are offset from one another by a quarter-period. In the shown exemplary embodiment, the resolution of the two measurement signals 40a, 40b respectively amounts to 4 µm, meaning that a period of one of the two measurement signals 40a, 40b respectively corresponds to a distance of 4 µm traveled by the medium 12 to be printed to or by the transport belt 18.

Figure 4:
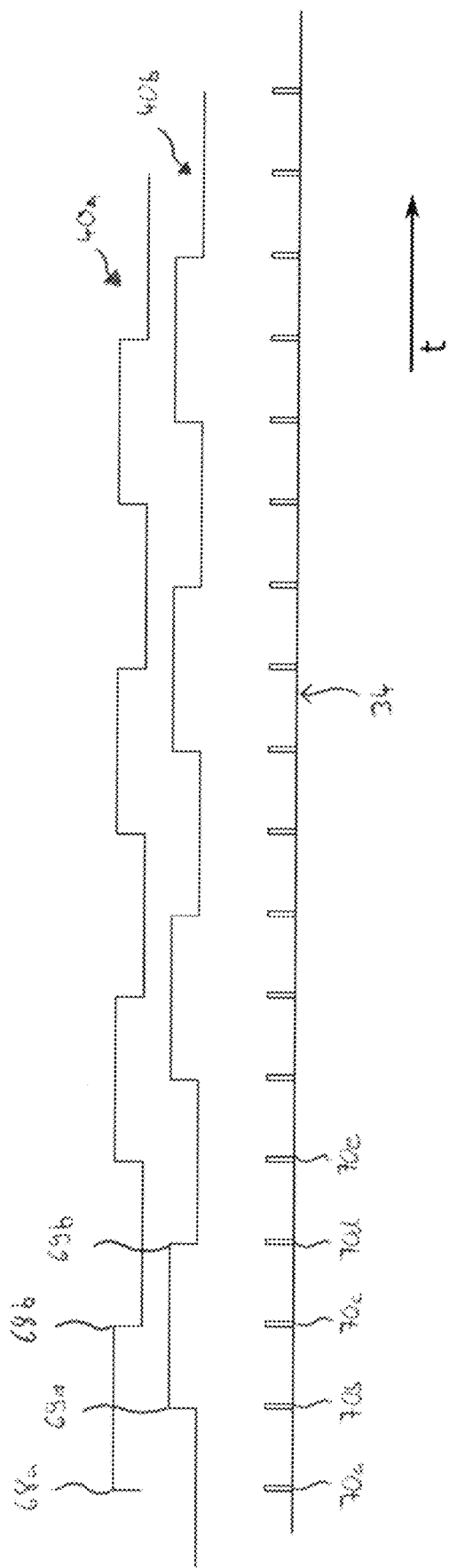
FIG. 4 illustrates a pulse diagram of two measurement signals and a sensor signal of a sensor of the device according to FIG. 3.

The first signal processor 42 of the sensor 32 generates the sensor signal 34 from the two measurement signals 40a, 40b. As shown in FIG. 4, a short pulse 70a through 70e is generated in the sensor signal 34 by the first signal processor 42 for each edge 68a and 68b of the first measurement signal 40a and each edge 69a and 69b of the second measurement signal 40b. In an exemplary embodiment, the first signal processor includes processor circuitry that is configured to perform one or more functions/operations of the first signal processor. Via the detection of each edge 68a, 68b, 69a, 69b of the two measurement signals 40a, 40b offset from one another by a quarter-period, a resolution is achieved that is higher by a factor of 4 than given observation of only one of the two measurement signals 40a, 40b, meaning that the period of the sensor signal 34 is shorter by a factor of 4 than the respective period of the two measurement signals 40a, 40b. Since the sensor signal 34 has a resolution that is four times greater than the two measurement signals 40a, 40b, it is referred to as a quadrature signal. In the shown exemplary embodiment, the resolution of the sensor signal 34 is thus 1 µm. The sensor signal 34 is transmitted to the controller 20a. The two measurement signals 40a, 40b and the sensor signal 34 are described in further detail below in connection with FIG. 4.

In an alternative embodiment, the sensor 32 transmits the two measurement signals 40a, 40b as a sensor signal 34 to the controller 20a, which—as described above—generates from this a quadrature signal and processes this further as described below.

In an exemplary embodiment, the controller 20a includes: a timing signal generator 38 that is configured to generate a timing signal 39 formed as a pulse sequence (see FIGS. 5, 7, and 9); a second signal processor 44; a third signal processor 50; a fourth signal processor 56; and an error corrector 58. The aforementioned timing signal generator 38, the second signal processor 44, third signal processor 50, fourth signal processor 56, and/or error corrector 58 of the controller 20a are preferably formed by the circuit structure or components of a field programmable gate array (FPGA) or a complex programmable logic device (CPLD). Alternatively, they may be provided by a digital signal processor. In an exemplary embodiment, the timing signal generator 38, the second signal processor 44, third signal processor 50, fourth signal processor 56, and/or error corrector 58 include processor circuitry that is configured to perform one or more of their respective functions/operations.

The second signal processor 44 of the controller 20a determines a number of pulses of the timing signal 39 that are generated chronologically between two successive pulses of the sensor signal 34. For this purpose, after detection of a first pulse 70a of the sensor signal 34a first counter is incremented whenever a pulse of the timing signal 39 is determined. If a second pulse 70b following the first pulse 70a of the sensor signal 34 is detected, the current value of the first counter is stored as a first stored value 48, the first stored value 48 is transmitted to the third signal processor 50, and the first counter is reset to zero again. After detection of the second pulse 70b of the sensor signal 34, a second counter is increased whenever a pulse of the timing signal 39 is determined. If a third pulse 70c following the second pulse 70b of the sensor signal 34 is detected, the current value of the second counter is stored as the first stored value 48, the first stored value 48 is transmitted to the third signal processor 50, and the second counter is reset to zero again. After this, the first counter begins to count the pulses of the timing signal 39 again.

Figure 5:
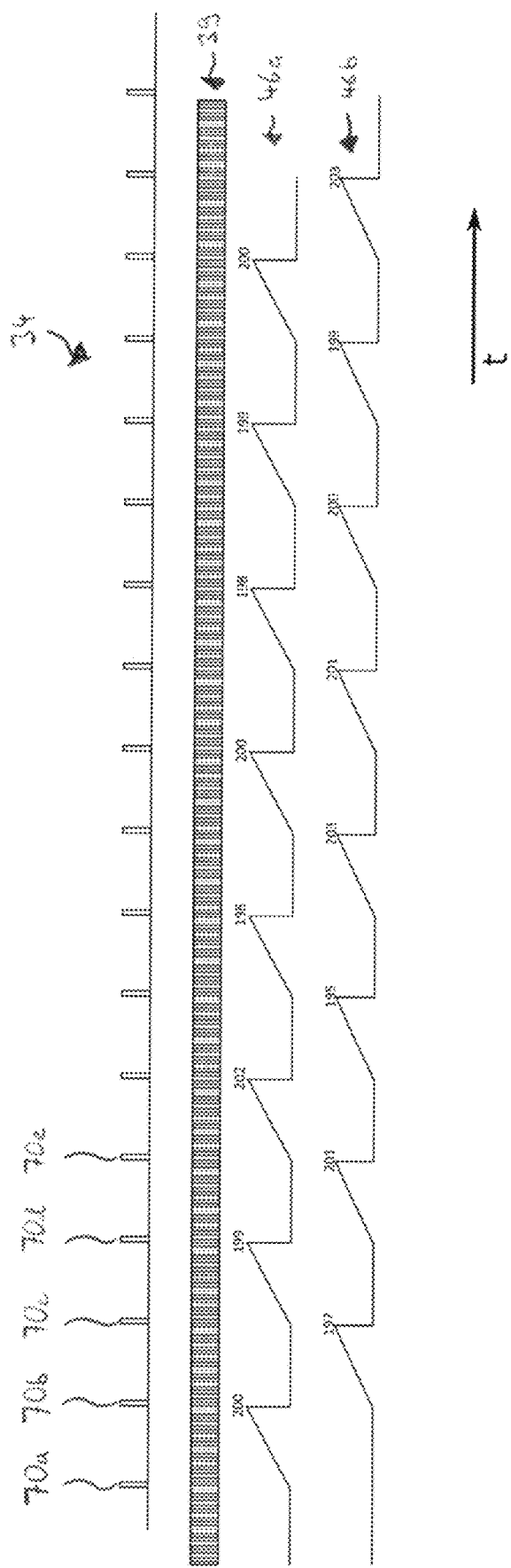
FIG. 5 illustrates a pulse diagram, according to an exemplary embodiment, of the sensor signal and of a timing signal, and the time curve of the value of a first counter and a second counter of the device according to FIG. 3.

The two counters alternately count the number of pulses of the timing signal 39, which are generated chronologically between two successive pulses of the sensor signal 34, until pulses 70a through 70e of the sensor signal 34 are no longer detected. The time curves of the values of the first and second counter are shown in FIGS. 5 and 6 and there are designated with the reference characters 46a or 46b.

Figure 6:
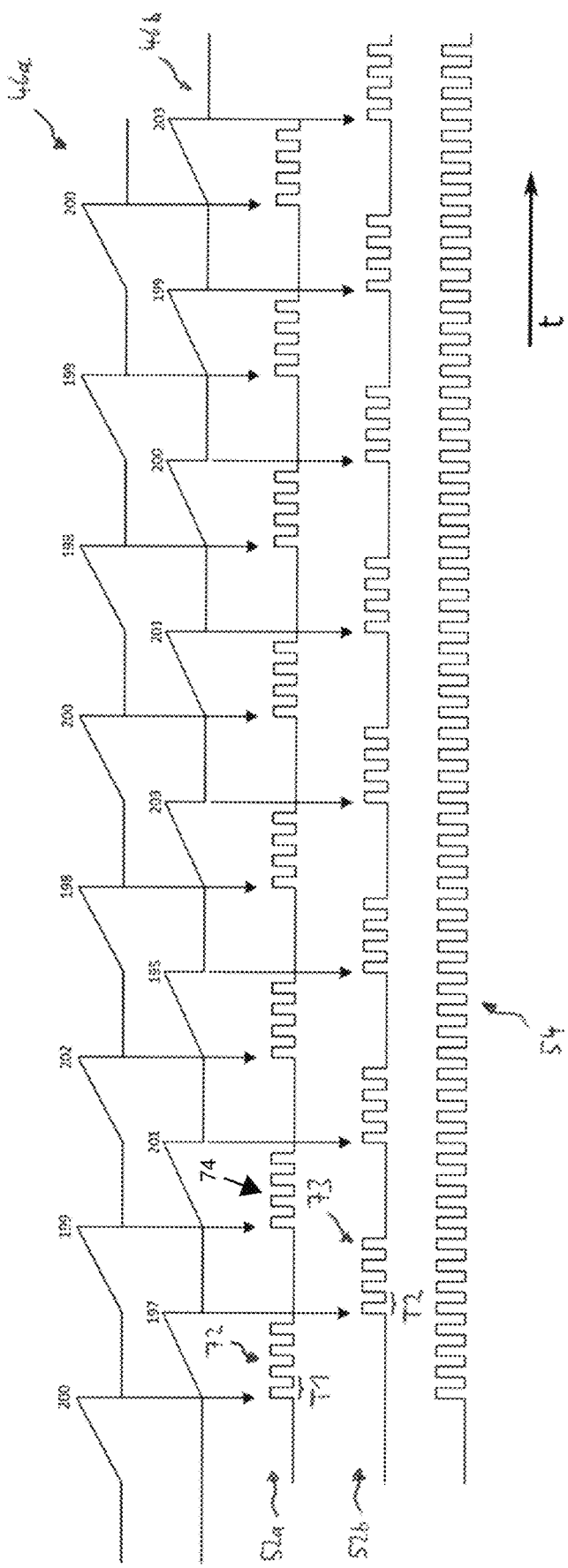
FIG. 6 illustrates time curves of the values of the first counter and of the second counter, and respectively a pulse diagram of a first pre-signal and a second pre-signal and of an intermediate timing signal, according to an exemplary embodiment, of the device according to FIG. 3.

Beginning with the second pulse 70b of the sensor signal 34, the third signal processor 50 of the controller 20a generates a first pre-signal formed as a pulse sequence, which pre-signal is shown in FIG. 6 and there is designated with the reference character 52a. The period duration of the first pre-signal 52a is identical to the period duration of the timing signal 39 multiplied by a factor that is identical to the most recently transmitted first stored value—meaning the number of pulses of the timing signal that has been determined by the second signal processor 44, which pulses of the timing signal have been determined between the first pulse 70a of the sensor signal 34 and the second pulse 70b of the sensor signal 34—divided by a predetermined divisor.

The third signal processor 50 stops the generation of the first pre-signal 52a if this detects the third pulse 70c of the sensor signal 34 or if a preset number of pulses of the first pre-signal 52a that is equal to the divisor have been generated, and generates a second pre-signal formed as a pulse sequence, which second pre-signal is shown in FIG. 6 and there is designated with the reference character 52b. The period duration of the second pre-signal 52b is identical to the period duration of the timing signal 39 multiplied by a factor that is identical to the most recently transmitted first stored value—meaning the number of pulses of the timing signal that has been determined by the second signal processor 44, which pulses of the timing signal have been determined between the second pulse 70b of the sensor signal 34 and the third pulse 70c of the sensor signal 34—divided by the predetermined divisor.

The third signal processor 50 stops the generation of the second pre-signal 52b if this detects a fourth pulse 70d following the third pulse 70c of the sensor signal 34, or if a number of pulses of the second pre-signal 52b that is equal to the divisor have been generated, and again generates the first pre-signal 52a.

The third signal processor 50 alternately generates the first pre-signal 52a and the second pre-signal 52b until pulses 70a through 70e of the sensor signal 34 are no longer detected. The period duration of the first pre-signal 52a, or the period duration of the second pre-signal 52b, are respectively identical to the period duration of the timing signal 39 multiplied by a factor that is identical to the most recently transmitted first stored value divided by a predetermined divisor.

From the first pre-signal 52a and second pre-signal 52b that are generated in alternation, the third signal processor 50 generates an intermediate timing signal 54 that is described in more detail further below using FIG. 6, and transmits said intermediate timing signal 54 to the fourth signal processor 56 of the controller 20a and to the error corrector 58. In the shown exemplary embodiment, the predetermined divisor is equal to four. The intermediate timing signal 54 therefore has an assumed resolution of 0.25 μm.

The fourth signal processor 56 of the controller 20a generates the output signal 36 with the aid of the intermediate timing signal 54. For this purpose, the fourth signal processor 56 counts a first number of successive pulses of the intermediate timing signal 54 and stores the first number as a second stored value. If the second stored value has reached a first nominal value, the fourth signal processor 56 generates a signal change in the output signal 36. For example, the fourth signal processor 56 generates a pulse or an edge in the output signal 36.

In the shown exemplary embodiment, the two measurement signals 40a, 40b with a resolution of 4 μm that are generated with the aid of the sensor 32 are converted into the output signal 36 with a resolution of 1/7200 of an inch=3.527 μm. For this purpose, 14 respective pulses of the intermediate timing signal 54 are first counted eight times by the fourth signal processor 56 before a signal change in the output signal 36 is generated. The intervals between two signal changes of the output signal 36 respectively correspond in this instance to a distance of 3.5 μm traveled by the medium 12 to be printed to, or by the transport belt 18. The error between the desired resolution of 1/7200 of an inch=3.527 μm and the actual resolution of the output signal 36 is −0.027 μm. Over eight periods of the output signal, this error adds up to −0.22216 μm. After the fourth signal processor 56 has respectively counted 14 pulses of the intermediate timing signal 54 eight times, the fourth signal processor 56 counts fifteen pulses of the intermediate timing signal 54. The intervals between two signal changes of the output signal 36 then correspond to a distance of 3.75 μm traveled by the medium 12 to be printed to, or by the transport belt 18. The error between the desired resolution of 1/7200 of an inch=3.527 μm and the actual resolution of the output signal 36 here is now 0.222 μm.

A mean resolution of (8×(14×0.25 μm)+1×(15×0.25 μm))/9=3.527 μm=1/7200 of an inch results over the in total nine generated periods of the output signal 36. This means that, after eight periods of the output signal, a maximum deviation from the desired resolution of 1/7200 of an inch is reached, and a deviation is no longer present after the ninth period. After the generation of nine periods of the output signal 36, the workflow for the generation of nine additional periods of the output signal 36 begins again from the start.

In an exemplary embodiment, the error corrector 58 is optional and includes an edge counter 60, an intermediate timing signal counter 62, and a comparator 64. The edge counter 60 determines a number of pulses 70a through 70e of the sensor signal 34. The intermediate timing signal counter 62 determines a number of pulses of the intermediate timing signal 54. The comparator 64 determines whether the number of pulses of the intermediate timing signal 54 that are generated chronologically between two pulse edges of the sensor signal 34 is identical to a predetermined second nominal value. If a discrepancy is determined, the comparator 64 transmits a correction signal 66 to the fourth signal processor 56.

If the fourth signal processor 56 receives the correction signal 66, this adds the value of the difference between the predetermined second nominal value and the second number to the second stored value. In the shown exemplary embodiment, the second nominal value is identical to the divisor, meaning that the fourth signal processor 56 always generates the output signal 36 as if a number of pulses of the intermediate timing signal 54 that corresponds to the divisor would have been generated chronological between two pulses of the sensor signal 34. It is hereby achieved that no errors are accumulated given disturbances such as jitter.

FIG. 4 respectively shows a pulse diagram of the two measurement signals 40a, 40b and of the sensor signal 34 that are generated by the sensor 32. The signals of the device 100a that are shown in the following Figures are in particular formed as electrical signals switching between two voltage values (or logic level ranges). A first voltage value, for example ≤0.8V, represents a logical zero, and a second voltage value, for example ≥2.0V, represents a logical one. The signals are respectively shown as a chronological sequence of logical zeros (represented as a lower horizontal line) and logical ones (represented as an upper horizontal line). The time axis t of the diagram travels from left to right in FIG. 4.

The two measurement signals 40a, 40b are respectively formed as a pulse sequence of rectangular pulses having a duty factor of, for example, 50%. The sensor signal 34 has a pulse 70a through 70e for each edge 68a, 68b of the first measurement signal 40a and each edge 69a, 69b of the second measurement signal 40b. The pulses 70a through 70e of the sensor signal 34 are, for example, formed as rectangular pulses having a duty factor in a range between 1 and 10%. Alternatively, the duty factor of the sensor signal 34 is chosen so that the pulse duration of the pulses 70a through 70e of the sensor signal 34 corresponds to the pulse duration of the timing signal 38.

FIG. 5 respectively shows a pulse diagram of the sensor signal 34 and of the timing signal 39, and the time curves of the values of the first counter 46a and of the second counter 46b. The time axis t of the diagram in FIG. 5 travels from left to right.

The first counter 46a begins to count the pulses of the timing signal 39 as of the first pulse 70a of the sensor signal 34. At the second pulse 70b of the sensor signal 34, the first counter 46a has reached a value of 200 and is reset to a value of zero. As of the second pulse 70b, the second counter 46b begins to count the pulses of the timing signal 39. As of the third pulse 70c of the sensor signal 34, the second counter 46b has reached a value of 197 and is reset back to a value of zero. As of the third pulse 70c, the first counter 46a begins to count the pulses of the timing signal 39 again.

FIG. 6 shows the time curve of the value of the first counter 46a and of the second counter 46b, and respectively a pulse diagram of the first pre-signal 52a and of the second pre-signal 52b and of the intermediate timing signal 54. The time axis t of the diagram travels from left to right in FIG. 6.

If the first counter 46a has reached a value of 200, i.e. at the point in time of the second pulse 70b of the sensor signal 34 in FIG. 5, and is reset to a value of zero, a four period-long first pulse sequence 72 of rectangular pulses with a duty factor of 50% is generated in the first pre-signal 52a. The period duration T1 of the first pulse sequence 72 is thereby identical to the period duration of the timing signal 39 multiplied by a factor that is equal to the last value of the first counter, i.e. in the exemplary embodiment 200 shown in FIG. 200, divided by the predetermined divisor, i.e. four in the exemplary embodiment shown in FIG. 6, and rounded down to a whole number. The factor for the determination of the period duration T1 of the first pulse sequence 72 is thus equal to 50 in the exemplary embodiment shown in FIG. 6.

If the second pulse 70b is detected, the second counter 46b begins to count the timing pulses of the timing signal 39. At the point in time of the third pulse 70c of the sensor signal 34 in FIG. 5, the second counter 46b has reached a value of 197 and is reset to a value of zero. Subsequently, meaning as of detection of the third pulse 70c, a second pulse sequence 73 of rectangular pulses with a duty cycle of 50% is generated in the second pre-signal 52b. The period duration T2 of the second pulse sequence 73 is thereby identical to the period duration of the timing signal 39 multiplied with a factor that is equal to the last value of the second counter, i.e. 197 in the exemplary embodiment shown in FIG. 6, divided by the predetermined divisor, i.e. four in the exemplary embodiment shown in FIG. 6, and rounded down to a whole number. The factor for the determination of the period duration T2 of the second pulse sequence 73 is thus equal to 49 in the exemplary embodiment shown in FIG. 6. Pulses with four periods are generated due to the interval to the next pulse of the pulse sequence of the sensor signal 34.

As of the next pulse of the sensor signal, the second counter 46b is again reset to a value of zero, and the first counter 46a again begins to count the timing pulses of the timing signal 39, and the sequence for generating the first pre-signal 52a and the second pre-signal 52b is repeated.

Figure 7:
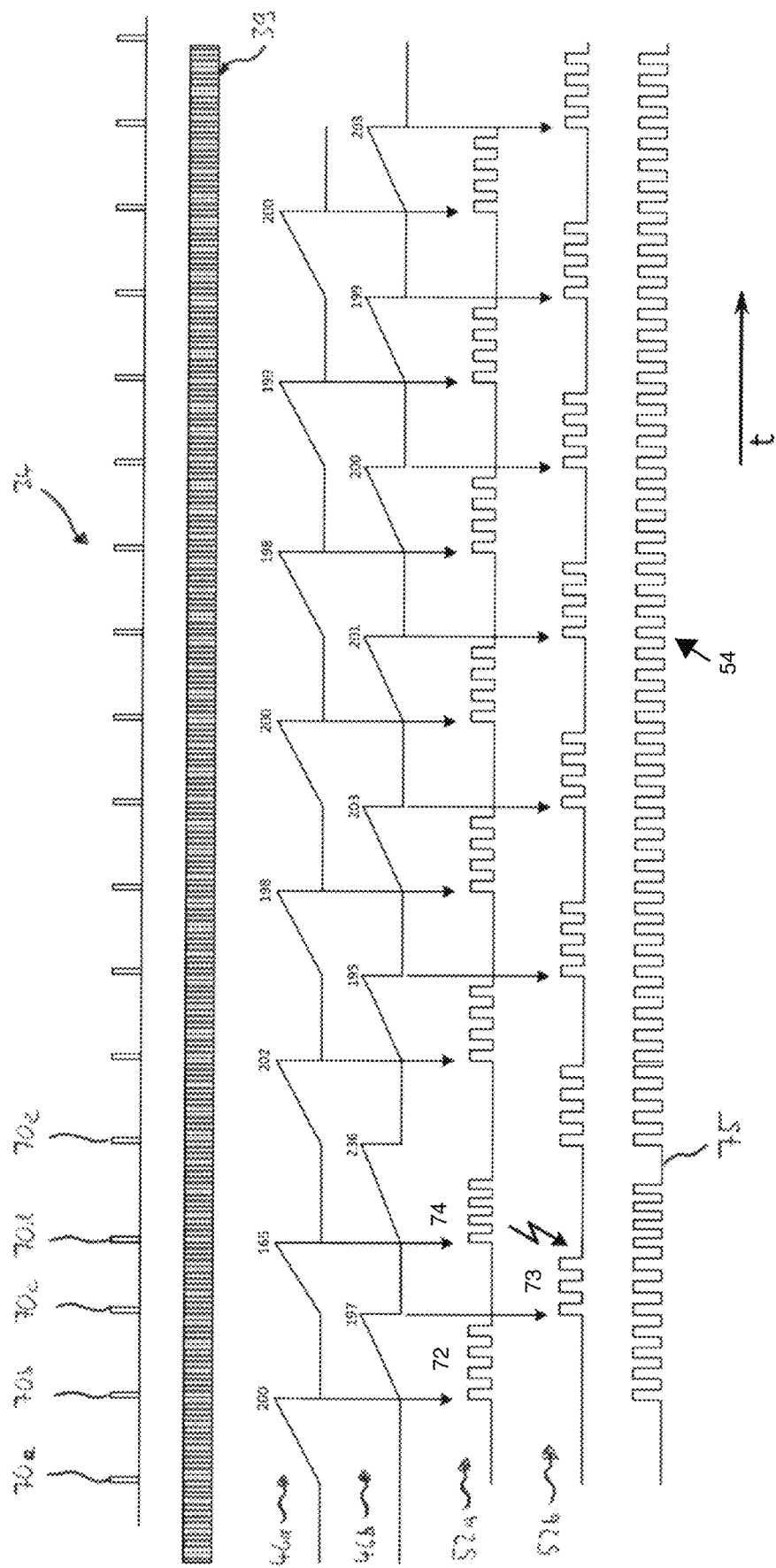
FIG. 7 illustrates a pulse diagram, according to an exemplary embodiment, of various signals as they are generated in the operation of the device according to FIG. 3 given the occurrence of jitter or other sensor errors.

FIG. 7 respectively shows a pulse diagram of the sensor signal 34, the timing signal 39, the first pre-signal 52a, the second pre-signal 52b, and the intermediate timing signal 54, as well as the time curves of the values of the first counter 46a and the second counter 46b. The time axis t of the diagram travels from left to right in FIG. 7.

The functionality of the error corrector 58 of the device 100a according to the first embodiment according to FIG. 3 is explained by way of example using FIG. 7. First, the first pulse sequence 72 in the first pre-signal 52a is generated as described using FIG. 6. In the following generation of the second pulse sequence 73, the first counter 46a does not count 199 pulses of the timing signal 39, as in FIG. 6, but rather only 165, since the fourth pulse 70d of the sensor signal 34 was generated earlier. For example, this is the case given the occurrence of jitter. Since one period of the second pulse sequence 73 corresponds to 24 periods of the pulses of the timing signal 39, only fewer than three periods of the second pulse sequence 73 are generated in the second pre-signal 52b before the first counter is reset to a value of zero and the generation of the second pulse sequence 73 in the second pre-signal 52b is stopped.

The discrepancy between the second nominal value (i.e. four periods of the first or second pre-signal 46a, 46b between two pulses of the sensor signal 34 in the shown exemplary embodiment) and the real value (i.e. only three periods of the first pre-signal 46a between the third pulse 70c and the fourth pulse 70d of the sensor signal 34 in the shown exemplary embodiment) is determined by the error corrector 58 described using FIG. 3 and is transmitted as a correction signal 66 to the fourth signal processor 56. The fourth signal processor 56 compensates for this discrepancy with the aid of the method described in connection with FIG. 3.

After the first counter 46a has been reset to a value of zero and the generation of the second pulse sequence 73 in the second pre-signal 52b has been stopped, a pulse sequence 74 of rectangular pulses with a duty factor of 50%, said pulse sequence 74 being four periods in length, is generated in the first pre-signal 52a. Because the sensor signal 34 has been generated earlier than expected, the second counter 46b counts 236 pulses of the timing signal until the detection of a fifth pulse 70e following the fourth pulse 70d. Since one period of the third pulse sequence 74 corresponds to 41 periods of the timing signal, 72 periods of the timing signal pass before an additional pulse sequence is generated in the second pre-signal 52b. A gap hereby arises in the pulse sequence of the intermediate timing signal 54. However, the total number of pulses is hereby not incorrect.

Figure 8:
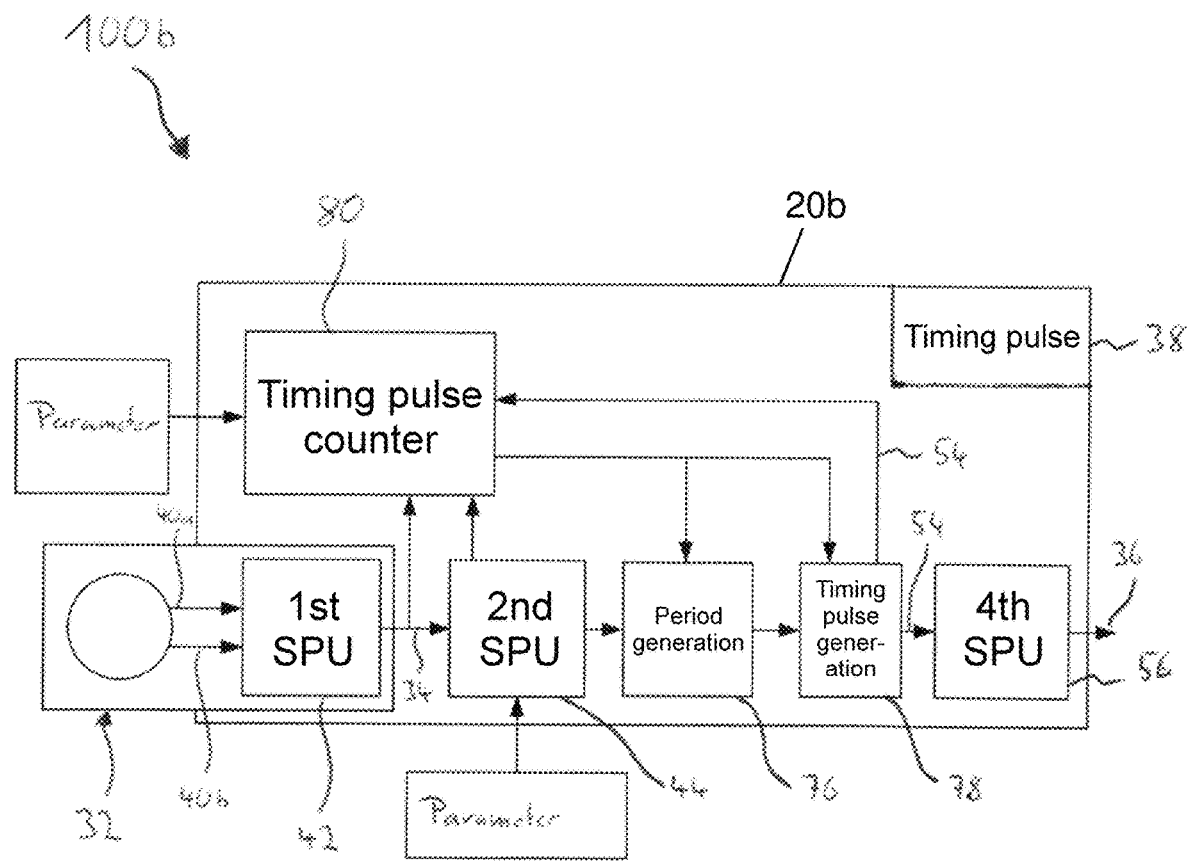
FIG. 8 illustrates a device for generating the output signal formed as a pulse sequence according to an exemplary embodiment.

FIG. 8 shows a block diagram of a device 100b for generating the output signal 36 formed as a pulse sequence, according to a second embodiment. The device 100b includes a controller 20b and the sensor 32. Identical elements or elements having identical effect are designated with the same reference characters.

The sensor 32 generates the sensor signal 34 as described using FIGS. 3 and 4. The sensor 32 transmits the sensor signal 34 to the controller 20b.

In an exemplary embodiment, the controller 20b includes the second signal processor 44, a period generator 76, an intermediate timing signal generator 78, an intermediate timing signal counter 80, and the fourth signal processor 56. In an exemplary embodiment, the second signal processor 44, the period generator 76, the intermediate timing signal generator 78, the intermediate timing signal counter 80, and/or the fourth signal processor 56 of the controller 20b are formed by the circuit structure or components of a field programmable gate array (FPGA) or of a complex programmable logic device (CPLD). Alternatively, they may be provided by a digital signal processor. In an exemplary embodiment, the second signal processor 44, the period generator 76, the intermediate timing signal generator 78, the intermediate timing signal counter 80, and/or the fourth signal processor 56 include processor circuity that is configured to perform one or more of their respective functions/operations.

The second signal processor 44 of the controller 20b determines the number of pulses of the timing signal 39 that are generated chronologically between two successive pulses of the sensor signal 34 as described using FIG. 3.

The period generator 76 divides the number of pulses of the timing signal 39 (which number of pulses is determined by the second signal processor 44) that are generated chronologically between two successive pulses of the sensor signal 34 by the predetermined divisor, and transmits the result to the intermediate timing signal generator 78. The intermediate timing signal generator 78 generates the intermediate timing signal 54, which is formed as a pulse sequence of rectangular pulses with a duty factor of 50%. The period duration of the intermediate timing signal 54 is identical to the period duration of the timing signal 39 multiplied with the result transmitted by the period generator 76.

The intermediate timing signal counter 80 respectively increases an intermediate timing signal counter by an increment if the intermediate timing signal counter 80 detects a pulse 70a through 70e of the sensor signal 34, and reduces the intermediate timing signal counter by a decrement if the intermediate timing signal counter 80 detects a pulse in the intermediate timing signal 54. The increment is equal to the divisor, i.e. is equal to four in the shown exemplary embodiment, and the decrement is equal to one. The time curve of the value of the intermediate timing signal counter is depicted in FIG. 9 and there is designated with the reference character 82.

The fourth signal processor 56 of the controller 20b generates the output signal 36 with the aid of the intermediate timing signal 54, as described using FIG. 3. The generation of the intermediate timing signal takes place until the intermediate timing signal 82 of the intermediate timing signal counter 80 reaches a value of zero.

Figure 9:
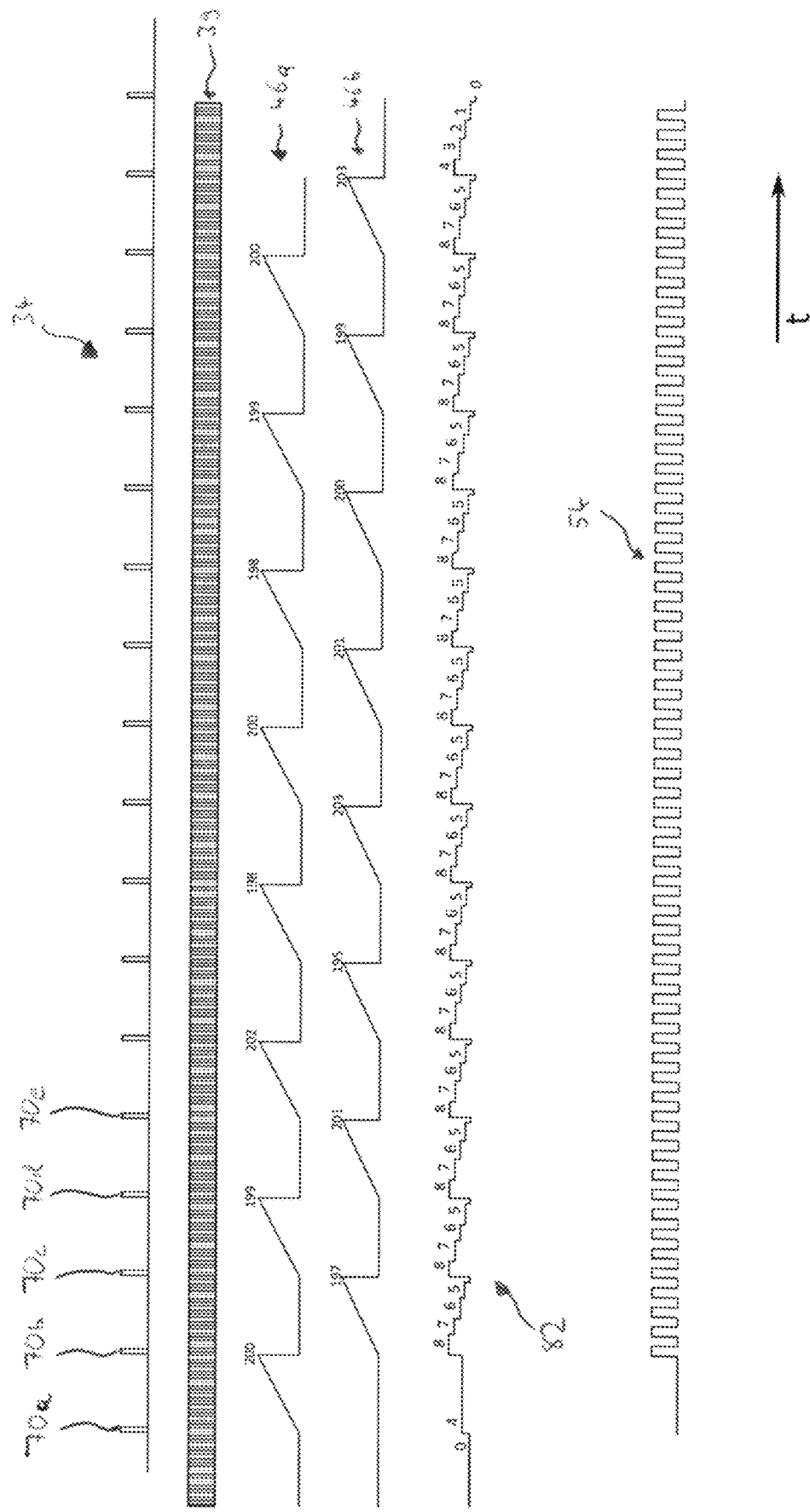
FIG. 9 illustrates time curves of the values of a first counter, of a second counter, and of an intermediate timing signal counter, and a pulse diagram of an intermediate timing signal of the device according to FIG. 8.

FIG. 9 shows the time curves of the values of the first counter 46a, of the second counter 46b, and of the intermediate timing signal 82, as well as a pulse diagram of the intermediate timing signal 54. The time axis t of the diagram travels from left to right in FIG. 9.

The value of the intermediate timing signal 82 is incremented by one for each pulse 70a through 70e of the sensor signal 34. The value of the intermediate timing signal 82 begins at a value of zero. The intermediate timing signal 82 has a value of four between the first pulse 70a and the second pulse 70b of the sensor signal 34. The intermediate timing signal generator 78 begins the generation of pulses of the intermediate timing signal 54 after the second pulse 70b of the sensor signal 34. The intermediate timing signal 82 initially has a value of eight after the second pulse 70b. The value of the intermediate timing signal 82 is reduced by one with each pulse of the intermediate timing signal 54. After the third pulse 70c of the sensor signal 34, the value of the intermediate timing signal 82 has increased from five to eight. This is repeated for subsequent pulses 70 of the sensor signal 34 until pulses 70 of the sensor signal 34 are no longer generated and the intermediate timing signal 82 finally reaches a value of zero again.

Based on the output signal 36, for example, a print timing signal may be generated in which steps are counted depending on a preset resolution of 1/7200 of an inch, until a print pulse is generated, for example for activation of the print heads 16 of the printing unit 14. The divisor preferably has a value of $2^n$, wherein n≤4 is preferable. Other values for the divisor are possible, for example 3, 5, 7, or 9.

Via the embodiments described using FIGS. 1 through 9, in the concrete example of a printing application, it is shown how the device for generating an output signal formed as a pulse sequence can be used to increase the resolution of the sensor signal depending on said sensor signal.

Conclusion

The aforementioned description of the specific embodiments will so fully reveal the general nature of the disclosure that others can, by applying knowledge within the skill of the art, readily modify and/or adapt for various applications such specific embodiments, without undue experimentation, and without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general purpose computer.

For the purposes of this discussion, the term "processor circuitry" shall be understood to be circuit(s), processor(s), logic, or a combination thereof. A circuit includes an analog circuit, a digital circuit, state machine logic, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor.

The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

REFERENCE LIST 10 device
12 medium
14 printing unit
16 print head
18 transport belt
20, 20a, 20b controller
22 drive roller
24 deflection roller
26 motor controller
28 motor control signal
30 input unit
32 sensor
32a encoder
32b, 32c rotary encoder
34 sensor signal
36 output signal
38 timing signal generator
39 timing signal
40a, 40b measurement signal
42, 44 signal processor
46a, 46b counter
48 value
50 signal processor
52a, 52b pre-signal
54 intermediate timing signal
56 signal processor
58 error corrector
60 edge counter
62 intermediate timing signal counter
64 comparator
66 correction signal
68a, 68b, 69a, 69b edge
70a to 70e pulse
72, 73, 74 pulse sequence
75 gap
76 period generator
78 intermediate timing signal generator
80 intermediate timing signal counter
82 intermediate timing signal

The invention claimed is:

1. A device for generating an output signal, formed as a pulse sequence, depending on a sensor signal, with the device comprising:

a sensor that is configured to generate a sensor signal, formed as a first pulse sequence, based on a measurand determined by the sensor; and a controller having a timing signal generator that is configured to generate a timing signal formed as a pulse sequence, the controller being configured to:

determine a number of pulses of the timing signal that are generated chronologically between two pulse edges of the sensor signal;

store the determined number of pulses of the timing signal as a first stored value;

generate an intermediate timing signal formed as a second pulse sequence, wherein a period duration of the intermediate timing signal is based a period duration of the timing signal and the first stored value; and generate the output signal based on the intermediate timing signal, wherein the sensor is configured to:

generate a first measurement signal and a second measurement signal that are respectively formed as a pulse sequence, the first and second measurement signals being dependent on a path traveled by a medium to be printed to or by a transport configured to transport the medium to be printed to; and generate the sensor signal based on the first measurement signal and the second measurement signal.

2. The device according to claim 1, wherein the period duration of the intermediate timing signal is equal to a product of: (a) the period duration of the timing signal and (b) the first stored value divided by a predetermined divisor.

3. The device according to claim 2, wherein the controller is configured to:
determine a second number of pulses of the intermediate timing signal that are generated chronological between two pulse edges of the sensor signal;
compare the second number with a predetermined second nominal value; and
adjust the second stored value based on a difference between the predetermined second nominal value and the second number to the second stored value.

4. The device according to claim 2, wherein the controller is configured to:
count at least a first number of successive pulses of the intermediate timing signal;
store the at least first number as a second stored value;
in response to the second stored value reaching a first nominal value, generate a signal change in the output signal;
determine a second number of pulses of the intermediate timing signal that are generated chronological between two pulse edges of the sensor signal;
compare the second number with a predetermined second nominal value; and
adjust the second stored value based on a difference between the predetermined second nominal value and the second number to the second stored value, wherein the second nominal value is preferably equal to the divisor.

5. The device according to claim 4, wherein the controller is configured to:
compare the determined number of pulses of the timing signal that are generated chronologically between two pulse edges of the sensor signal with a predetermined third nominal value; and
store the third nominal value as a first stored value in response to the determined number of pulses of the timing signal being smaller than the third nominal value.

6. The device according to claim 2, wherein the controller is configured to generate, between two pulse edges of the sensor signal, at most a number of pulses in the intermediate timing signal that is equal to the divisor.

7. The device according to claim 2, wherein the controller is configured to:
detect pulse edges of the sensor signal;
respectively increase a counter by an increment in response to the controller detecting a pulse edge of the sensor signal; and
reduce the counter by a decrement in response to the controller generating a pulse in the intermediate timing signal, wherein the increment is equal to the divisor and the decrement is equal to one.

8. The device according to claim 2, wherein the period duration of the intermediate timing signal is equal to a product of (a) the period duration of the timing signal and (b) a factor that is equal to the determined number of pulses of the timing signal divided by the predetermined divisor and rounded to a whole number.

9. The device according to claim 8, wherein the predetermined divisor is a power of two.

10. The device according to claim 1, wherein the measurand determined by the sensor is a path traveled by a medium to be printed to or by a transport configured to transport the medium to be printed to.

11. The device according to claim 1, wherein the controller is configured to:
count at least a first number of successive pulses of the intermediate timing signal;
store the at least first number as a second stored value; and
in response to the second stored value reaching a first nominal value, generate a signal change in the output signal.

12. The device according to claim 1, wherein the controller is configured to:
detect pulse edges of the sensor signal;
respectively increase a counter by an increment in response to the controller detecting a pulse edge of the sensor signal; and
reduce the counter by a decrement in response to the controller generating a pulse in the intermediate timing signal.

13. The device according to claim 1, wherein the controller is configured to:
compare the determined number of pulses of the timing signal that are generated chronologically between two pulse edges of the sensor signal with a predetermined nominal value; and
store the nominal value as a first stored value in response to the determined number of pulses of the timing signal being smaller than the nominal value.

14. The device according to claim 1, wherein the first measurement signal and the second measurement signal are offset from one another by a quarter-period.

15. The device according to claim 1, wherein the device is a printer configured to print to a recording medium.

16. A method for generating an output signal, formed as a pulse sequence, depending on a sensor signal, the method comprising:
generating, by a sensor, a sensor signal, formed as a first pulse sequence, based on a measurand determined by the sensor;
generating a timing signal formed as a pulse sequence;
determining a number of pulses of the timing signal that are generated chronologically between two pulse edges of the sensor signal;
storing the determined number of pulses of the timing signal as a first stored value;
generating an intermediate timing signal formed as a second pulse sequence, wherein a period duration of the intermediate timing signal is based on a period duration of the timing signal and the first stored value; and
generating the output signal based on the intermediate timing signal,
wherein generating the sensor signal comprises:
generating, by the sensor, a first measurement signal and a second measurement signal that are respectively formed as a pulse sequence, the first and second measurement signals being dependent on a path traveled by a medium to be printed to or by a transport configured to transport the medium to be printed to; and
generating, by the sensor, the sensor signal based on the first measurement signal and the second measurement signal.

17. The method according to claim 16, wherein the period duration of the intermediate timing signal is equal to a product of (a) the period duration of the timing signal and (b) the first stored value.

18. The method according to claim 16, wherein the period duration of the intermediate timing signal is equal to a product of (a) the period duration of the timing signal and (b) the first stored value divided by a predetermined divisor.

19. A non-transitory computer-readable storage medium with an executable program stored thereon, that when executed, instructs a processor to perform the method of claim 16.

* * * * *